(12) United States Patent
Ko et al.

(10) Patent No.: US 9,276,047 B2
(45) Date of Patent: Mar. 1, 2016

(54) METHOD FOR MANUFACTURING FLEXIBLE DISPLAY DEVICE

(71) Applicant: Samsung Display Co., Ltd., Yongin, Gyeonggi-Do (KR)

(72) Inventors: Yo-Sub Ko, Yongin (KR); Beung-Hwa Jeong, Yongin (KR); Hong-Ro Lee, Yongin (KR); Chang-Mo Park, Yongin (KR); Sung-Hoon Hong, Yongin (KR)

(73) Assignee: SAMSUNG DISPLAY CO., LTD. (KR)

( * ) Notice: Subject to any disclaimer, the term of this patent is extended or adjusted under 35 U.S.C. 154(b) by 28 days.

(21) Appl. No.: 14/168,859

(22) Filed: Jan. 30, 2014

(65) Prior Publication Data

US 2015/0050758 A1    Feb. 19, 2015

(30) Foreign Application Priority Data

Aug. 14, 2013 (KR) .................. 10-2013-0096830

(51) Int. Cl.
*H01L 51/56* (2006.01)
*H01L 27/32* (2006.01)

(52) U.S. Cl.
CPC ....... *H01L 27/3223* (2013.01); *H01L 2227/326* (2013.01)

(58) Field of Classification Search
CPC ..................................... H01L 21/007
See application file for complete search history.

(56) References Cited

U.S. PATENT DOCUMENTS

| 2008/0283836 | A1* | 11/2008 | Lee ................. | 257/59 |
| 2010/0123160 | A1* | 5/2010 | Hatano et al. .......... | 257/99 |
| 2011/0221333 | A1* | 9/2011 | Kim ............... | 313/504 |
| 2011/0241562 | A1* | 10/2011 | Choi et al. ........ | 315/291 |
| 2011/0248953 | A1* | 10/2011 | Lee et al. ........ | 345/174 |
| 2013/0011969 | A1* | 1/2013 | Chen et al. ........... | 438/111 |

FOREIGN PATENT DOCUMENTS

| KR | 1020050082449 A | 8/2005 |
| KR | 1020120037665 A | 4/2012 |
| KR | 1020150029156 A | 3/2015 |

* cited by examiner

*Primary Examiner* — Kimberly Rizkallah
*Assistant Examiner* — Mounir Amer
(74) *Attorney, Agent, or Firm* — Cantor Colburn LLP

(57) ABSTRACT

A method for manufacturing a flexible display device includes forming a separation layer on a carrier substrate, laminating a flexible substrate having an area that is larger than an area of the separation layer, to the separation layer; forming a dummy pattern on and along an edge of the flexible substrate; exposing a portion of the separation layer by removing a portion of the flexible substrate at a side of the flexible substrate; and separating the separation layer and the flexible substrate from each other.

20 Claims, 12 Drawing Sheets

(a)

(b)

(c)

(a)

(b)

(c)

METHOD FOR MANUFACTURING FLEXIBLE DISPLAY DEVICE

This application claims priority to Korean Patent Application No. 10-2013-0096830 filed on Aug. 14, 2013, and all the benefits accruing therefrom under 35 U.S.C. §119, the entire contents of which are incorporated herein by reference.

BACKGROUND

1. Field

The invention relates to a method for manufacturing a display device, and more particularly, to a method for manufacturing a flexible display device using thin glass as a substrate.

2. Description of the Related Art

A flat panel display includes a display unit which displays an image. The display unit includes a substrate, and a plurality of pixels disposed on the substrate. When a flexible substrate such as a plastic film is used instead of a rigid substrate such as glass, the flat panel display may have a bendable characteristic to be a flexible display device. The flexible display device may be an organic light emitting diode display, a liquid crystal display or an electrophoretic display.

During a process for manufacturing the flexible display device, the flexible substrate is positioned on a hard carrier substrate, and is separated from the carrier substrate after the display unit is formed on the flexible substrate. The carrier substrate supports the flexible substrate that is easily bent to maintain the flexible substrate in a flat state during a process for forming the display unit.

SUMMARY

One or more exemplary embodiment of the invention provides a method for manufacturing a flexible display device including a relatively thin glass flexible substrate, which suppresses breakage defects of the flexible substrate by preventing spreading of cracks to the inside of the flexible substrate.

An exemplary embodiment of the invention provides a method for manufacturing a flexible display device. The method includes forming a separation layer on a carrier substrate, laminating a flexible substrate having an area which is larger than that of the separation layer, to the separation layer; forming a dummy pattern on and along an edge of the flexible substrate; exposing a portion of the separation layer by removing a portion of the flexible substrate at a side of the flexible substrate; and separating the separation layer and the flexible substrate from each other.

The carrier substrate and the flexible substrate may include glass. The flexible substrate may have a thickness which is smaller than that of the carrier substrate. The separation layer may be formed of a metal oxide including aluminum zinc oxide. The separation layer may have a thickness of about 50 angstroms (Å) to about 300 Å, and surface roughness of about 6 Å to about 15 Å.

In the exposing the portion of the separation layer, the flexible substrate may be cut along a first cutting line. The first cutting line may be spaced apart from an edge of the separation layer at the side of the flexible substrate, and may be aligned with an edge of the separation layer at remaining sides of the flexible substrate except for the side of the flexible substrate at which the portion of the separation layer is removed.

The method may further include removing a portion of the carrier substrate by cutting the carrier substrate along a second cutting line. The second cutting line may be aligned with the edge of the separation layer at each side of the flexible substrate.

In the separating the separation layer and the flexible substrate, a stripping apparatus may be inserted between the exposed portion of the separation layer and a corresponding edge of the flexible substrate to physically strip the flexible substrate from the separation layer.

In the forming the dummy pattern, a display unit including a plurality of layers is formed inside the dummy pattern. The dummy pattern may be formed of a same material as a layer among the plurality of layers of the display unit.

The display unit and the dummy pattern may overlap the separation layer. An edge of an external side of the dummy pattern may be inside an edge of an external side of the separation layer. The dummy pattern may include an internal dummy pattern portion, and an external dummy pattern portion closer to the edge of the external side of the separation layer than the internal dummy pattern portion.

The display unit may include a thin film transistor and an organic light emitting diode. The thin film transistor may include a semiconductor layer, a gate electrode, and source and drain electrodes. The organic light emitting diode may include a pixel electrode, an organic light emitting layer and a common electrode.

The dummy pattern may be formed of a same material as the gate electrode or the source and drain electrodes. Alternatively, the dummy pattern may include a first layer formed of a same material as the gate electrode, and a second layer formed of a same material as the source and drain electrodes.

In the forming the dummy pattern, a touch sensor unit including a plurality of layers may be formed inside the dummy pattern. The dummy pattern may be formed of a same material as a layer among the plurality of layers of the touch sensor unit.

The touch sensor unit and the dummy pattern may overlap the separation layer. An edge of an external side of the dummy pattern may be positioned inside an edge of an external side of the separation layer. The dummy pattern may include an internal dummy pattern portion, and an external dummy pattern portion closer to the edge of the external side of the separation layer than the internal dummy pattern portion.

The touch sensor unit may include first sensing patterns continuously extended in a first direction, and discrete second sensing patterns arranged in a second direction crossing the first direction, and electrically connected to each other by a connection pattern. A plurality of wires may be connected to the first sensing patterns and the second sensing patterns. The dummy pattern may be formed of a same material as the first sensing patterns, the second sensing patterns, the connection pattern or the plurality of wires.

The touch sensor unit may further include an insulating layer covering the first sensing patterns and the second sensing patterns, and a via hole defined in the insulating layer, and a protective layer covering the connection pattern. The connection pattern may be connected to the second sensing patterns through the via hole. The dummy pattern may include a first layer formed of a same material as the first sensing patterns and the second sensing patterns, a second layer formed of a same material as the insulating layer, a third layer formed of a same material as the connection pattern, and a fourth layer formed of a same material as the protective layer.

According to one or more exemplary embodiment of the invention, it is possible to suppress spreading of cracks, formed when a flexible substrate is cut, to the inside of the flexible substrate by forming a dummy pattern at an edge of the flexible substrate. Accordingly, it is possible to suppress breakage defects of the flexible substrate due to spreading of the cracks during a process for cutting the flexible substrate, a process for separating the flexible substrate from a separation layer and one or more subsequent process.

BRIEF DESCRIPTION OF THE DRAWINGS

The above and other features of this disclosure will become more apparent by describing in further detail exemplary embodiments thereof with reference to the accompanying drawings in which.

DETAILED DESCRIPTION

Figure 1:
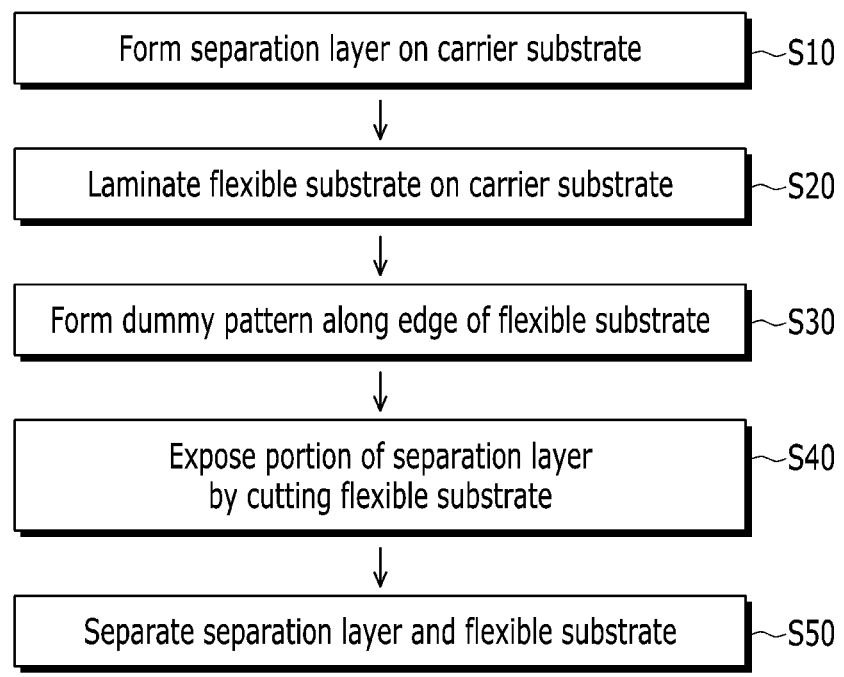
FIG. 1 is a process flowchart showing an exemplary embodiment of a method for manufacturing a flexible display device according to the invention.

Hereinafter, exemplary embodiments will be described in detail with reference to the accompanying drawings so that those skilled in the art may easily practice the invention. As those skilled in the art would realize, the described exemplary embodiments may be modified in various different ways, all without departing from the spirit or scope of the invention. In the drawings, the size and relative sizes of layers and regions may be exaggerated for clarity.

The terminology used herein is for the purpose of describing particular embodiments only and is not intended to be limiting of the invention. As used herein, the singular forms "a," "an" and "the" are intended to include the plural forms as well, unless the context clearly indicates otherwise. Throughout the specification, unless explicitly described to the contrary, the word "comprise" and variations such as "comprises" or "comprising" will be understood to imply the further inclusion of other elements.

Further, throughout the specification, it will be understood that when an element such as a layer, a film, a region, or a substrate is referred to as being "over" or "on" another element, it can be "directly on" the other element or intervening elements may also be present. Further, the word "~ on" means positioning on or below the object portion, but does not essentially mean positioning on the upper side of the object portion based on a gravity direction. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

A flexible display device includes a display unit in which a flexible substrate is disposed. A study has been conducted to use thin glass having a thickness of about 1 millimeter (mm) as a flexible substrate of a flexible display device. However, during a process for separating the thin glass flexible substrate from a carrier substrate which supports the flexible substrate to maintain the flexible substrate in a flat state during a process for forming the display unit, after an edge of the flexible substrate is cut, cracks initially formed when the edge is cut may be easily spread further into the flexible substrate. Accordingly, breakage defects of the flexible substrate may occur during a separation process from the carrier substrate or a subsequent process due to the spread cracks. Therefore, there remains a need for an improved flexible display device and method of manufacturing thereof which reduces damage thereto.

FIG. 1 is a process flowchart showing an exemplary embodiment of a method for manufacturing a flexible display device according to the invention.

Referring to FIG. 1, the method for manufacturing a flexible display device includes a first operation of forming (e.g., providing) a separation layer on a carrier substrate (S10), and a second operation of laminating a flexible substrate having an area that is larger than that of the separation layer, on the carrier substrate (S20). Further, the method for manufacturing a flexible display device includes a third operation of forming a dummy pattern along an edge of the flexible substrate (S30), a fourth operation of exposing a portion of the separation layer by cutting the edge of a side of the flexible substrate (S40), and a fifth operation of separating the separation layer and the flexible substrate from each other (S50).

The flexible substrate may include relatively thin glass having a thickness of about 1 mm. The dummy pattern suppresses spreading of fine cracks, which are formed at the edge of the flexible substrate from cutting the flexible substrate in the fourth operation (S40), further into the flexible substrate to reduce or effectively prevent breakage defects of the flexible substrate during the fifth operation (S50) and/or a subsequent process.

In an exemplary embodiment, the flexible substrate before cutting may be a mother substrate supporting a plurality of display units. With respect to the mother substrate, a plurality of display units is formed together with the dummy pattern during the third operation (S30). The dummy pattern may be formed in a same layer as and/or include the same material as at least one layer of a plurality of layers of the display units.

In another exemplary embodiment, the flexible substrate may be a mother substrate for encapsulation supporting a plurality of touch sensor units. A plurality of touch sensor units is formed together with the dummy pattern during the third operation (S30). The dummy pattern may be formed in a same layer as and/or include a same material as at least one layer of a plurality of layers of a plurality of touch sensor units.

In an exemplary embodiment of a manufacturing method according to the invention as will be described later, the flexible substrate as the mother substrate supporting a plurality of display units will be described. In another exemplary embodiment of a manufacturing method according to the invention, the flexible substrate as the mother substrate for encapsulation supporting a plurality of touch sensor units will be described.

Figure 2:
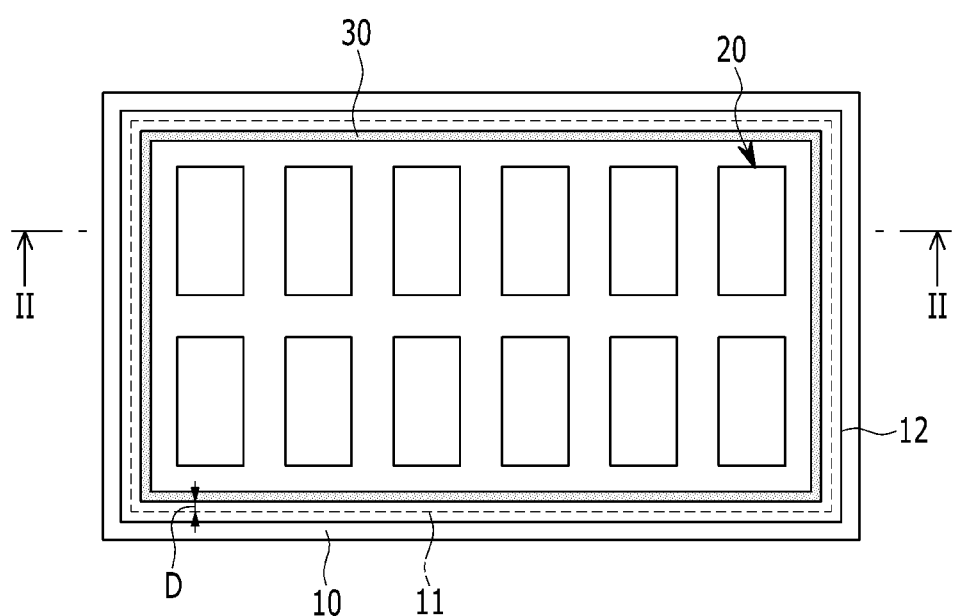
FIG. 2 is a top plan view showing an exemplary embodiment of a flexible display device formed in first to third operations shown in FIG. 1 in the method for manufacturing a flexible display device shown in FIG. 1.
Figure 3:
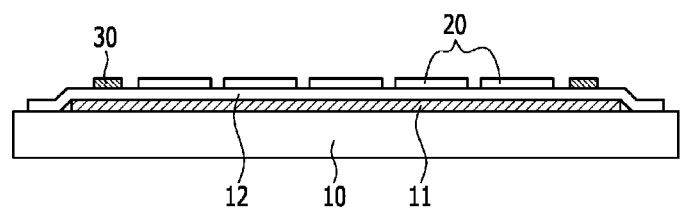
FIG. 3 is a cross-sectional view taken along line II-II of FIG. 2.

FIG. 2 is a top plan view showing an exemplary embodiment of a flexible display device formed in first to third operations shown in FIG. 1 in the method for manufacturing a flexible display device according to the invention, and FIG. 3 is a cross-sectional view taken along line II-II of FIG. 2. In the exemplary embodiment of FIGS. 2 and 3, the flexible substrate is the mother substrate supporting a plurality of display units.

Referring to FIGS. 2 and 3, a separation layer 11 is formed on a carrier substrate 10 during the first operation (S10). The carrier substrate 10 may include a rigid substrate. In one exemplary embodiment, for example, the carrier substrate 10 may include a glass substrate having a thickness of about 5 mm. The carrier substrate 10 supports a flexible substrate 12 to maintain the flexible substrate 12 in a flat state during the third operation of forming a plurality of display units 20 and a dummy pattern 30 (S30).

The separation layer 11 functions to adsorb the flexible substrate 12 on the carrier substrate 10 during the second operation (S20) to the fourth operations (S40), and also helps to easily separate the flexible substrate 12 from the carrier substrate 10 during the fifth operation (S50). The separation layer 11 may include a metal oxide, and for example, aluminum zinc oxide ("AZO").

The separation layer 11 may be formed in a cross-sectional thickness of about 50 angstroms (Å) to about 300 Å, and may have surface roughness of about 6 Å to about 15 Å. The cross-sectional thickness and the surface roughness of the separation layer 11 will be described later.

The flexible substrate 12 is laminated on the carrier substrate 10 during the second operation (S20). The flexible substrate 12 has a planar area that is larger than that of the separation layer 11. A bottom surface of the flexible substrate 12 comes into contact with the separation layer 11 at a central portion thereof, such as a portion spaced apart from edges thereof and an edge of the bottom surface of the flexible substrate 12 comes into contact with the carrier substrate 10. The flexible substrate 12 may include a relatively thin glass (also referred to as "paper glass") having a thickness of about 1 mm.

The carrier substrate 10 and the flexible substrate 12 each have a planar area that is larger than a total area of a plurality of flexible display devices so that a plurality of flexible display devices are capable of being manufactured simultaneously using the same carrier and flexible substrates 10 and 12. That is, the carrier substrate 10 and the flexible substrate 12 may serve to form portions of the mother substrate.

A plurality of display units 20 and the dummy pattern 30 are simultaneously formed on the flexible substrate 12 during the third operation (S30). The plurality of display units 20 are positioned to be spaced apart from each other. The dummy pattern 30 is formed in parallel with the edge of the flexible substrate 12 so as to surround all of the plurality of display units 20. The dummy pattern 30 has a length parallel to a respective edge of the flexible substrate. The dummy pattern 30 has a predetermined width taken perpendicular to the length, and is continuously formed along the edge of the flexible substrate 12 without disconnection. The continuous dummy pattern 30 may be a single, indivisible, unitary member, but is not limited thereto.

The dummy pattern 30 and the plurality of display units 20 overlap the separation layer 11 in the plan view. That is, the dummy pattern 30 and the plurality of display units 20 are formed on the central portion of the flexible substrate 12, which comes into contact with the separation layer 11. An edge of an external side of the dummy pattern 30 is positioned to be spaced apart from an edge of the separation layer 11 in a direction toward an internal side of the separation layer 11. In FIG. 2, a distance between the edge of the external side of the dummy pattern 30 and the edge of the separation layer 11 is designated by D.

One display unit 20 corresponds to one flexible display device, and each display unit 20 includes a plurality of pixels. When the flexible display device is an organic light emitting diode display, each pixel includes a pixel circuit, and an organic light emitting diode in which light emission is controlled by the pixel circuit. The pixel circuit may include at least two thin film transistors and at least one capacitor. The organic light emitting diode may include a pixel electrode, an organic light emitting layer and a common electrode.

The dummy pattern 30 may be formed in a same layer as and include a same material as at least one layer of a plurality of layers of the display unit 20. In one exemplary embodiment, for example, the dummy pattern 30 may be formed in a same layer as and include a same material as a gate electrode of the thin film transistor among the plurality of layers of the display unit 20, or may be formed in a same layer as and include a same material as source and drain electrodes of the thin film transistor of the display unit 20.

Figure 4:
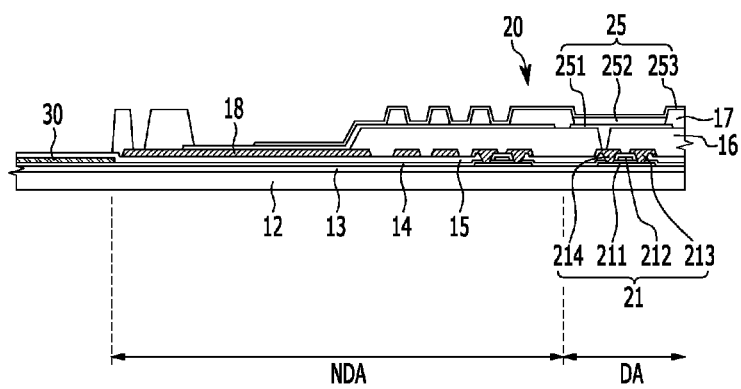
FIG. 4 is a partially enlarged cross-sectional view of FIG. 2, showing an exemplary embodiment of a dummy pattern according to the invention.

FIG. 4 is a partially enlarged cross-sectional view of FIG. 2, in which the dummy pattern 30 and the display unit 20 are shown to be partially enlarged.

Referring to FIG. 4, the display unit 20 includes a light emitting region DA in which an image is displayed, and a non-light emitting region NDA outside the light emitting region DA and in which an image is not displayed. The pixel circuit including a thin film transistor 21, and an organic light emitting diode 25 connected to the thin film transistor 21 is positioned in the light emitting region DA. The thin film transistor 21 includes a semiconductor layer 211, a gate electrode 212, and a source and drain electrodes 213 and 214.

The semiconductor layer 211 is positioned on the flexible substrate 12 with a buffer layer 13 interposed therebetween, and includes a channel region, and source and drain regions at respective sides of the channel region. The gate electrode 212 is positioned on the channel region with a gate insulating layer 14 interposed therebetween, and an interlayer insulating layer 15 covers the gate electrode 212. The source and drain electrodes 213 and 214 are positioned on the interlayer insulating layer 15, and are connected to the source and drain regions, respectively, through a via hole defined in one or more insulating layer.

The thin film transistor 21 shown in FIG. 4 is a driving thin film transistor. The pixel circuit further includes a switching thin film transistor and a capacitor not shown in the drawing. The switching thin film transistor is used as a switching element selecting the pixel from which light is to be emitted. The driving thin film transistor applies power from a power source (not shown) for enabling the selected pixel to emit light to the corresponding pixel. Herein, the pixel means a minimum light emitting unit for displaying an image.

In FIG. 4, the thin film transistor 21 having a top gate structure is shown as an example, but the structure of the thin film transistor is not limited to the shown example.

A planarization layer 16 covers the thin film transistor 21 to provide a flat surface for forming the organic light emitting diode 25 thereon. The organic light emitting diode 25 includes a pixel electrode 251 connected to the drain electrode 214 through a via hole defined in the planarization layer 16, an organic light emitting layer 252 formed on the pixel electrode 251, and a common electrode 253 covering a plurality of organic light emitting layers 252. A pixel definition layer 17 partitioning a pixel region is positioned between the pixel electrode 251 and the common electrode 253. The organic light emitting layer 252 is formed in an opening defined by portions of the pixel definition layer 17.

Either one of the pixel electrode 251 and the common electrode 253 is an anode as a hole injection electrode, and the other is a cathode as an electron injection electrode. Holes injected from the anode and electrons injected from the cathode are combined in the organic light emitting layer 252 to generate excitons, and light is emitted while the excitons emit energy.

Either one of the pixel electrode 251 and the common electrode 253 may be reflective, such as including or being formed as a reflective layer. The other one of the pixel electrode 251 and the common electrode 253 may be semi-transmissive or transparent, such as including or being formed as a semi-transmissive layer or a transparent conductive layer. Light emitted from the organic light emitting layer 252 is reflected by the reflective layer, and transmitted through the semi-transmissive layer or the transparent conductive layer, and emitted to the outside. Regarding the semi-transmissive layer, a portion of light emitted from the organic light emitting layer 252 is reflected again to the reflective layer to form a resonance structure.

A lighting circuit or an electrostatic discharge ("ESD") circuit, and a power source wire 18 supplying the power source to the common electrode 253, may be positioned in the non-light emitting region NDA.

In FIG. 4, the dummy pattern 30 is formed of the same material as the gate electrode 212 of the thin film transistor 21 as one of a plurality of layers of the display unit 20, and is positioned in and/or on the same layer as the gate electrode 212. The dummy pattern 30 and the gate electrode 212 may include a metal such as aluminum (Al), magnesium (Mg), nickel (Ni), chromium (Cr), molybdenum (Mo), tungsten (W), and gold (Au), and may be formed of a single layer or a plurality of layers.

Figure 5:
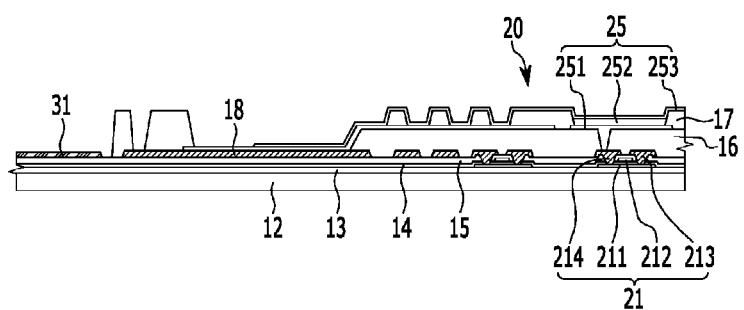
FIG. 5 is a partially enlarged cross-sectional view of FIG. 2, showing a modified exemplary embodiment of a dummy pattern according to the invention.

FIG. 5 is a partially enlarged cross-sectional view of FIG. 2, showing a modified exemplary embodiment of the dummy pattern shown in FIG. 4.

Referring to FIG. 5, a dummy pattern 31 is formed of the same material as the source and drain electrodes 213 and 214 of the thin film transistor 21 as one of a plurality of layers of the display unit 20, and is positioned in and/or on the same layer as the source and drain electrodes 213 and 214. The dummy pattern 31 and the source and drain electrodes 213 and 214 may include a metal such as aluminum (Al), magnesium (Mg), nickel (Ni), chromium (Cr), molybdenum (Mo), tungsten (W), and gold (Au), and may be formed of a single layer or a plurality of layers.

Figure 6:
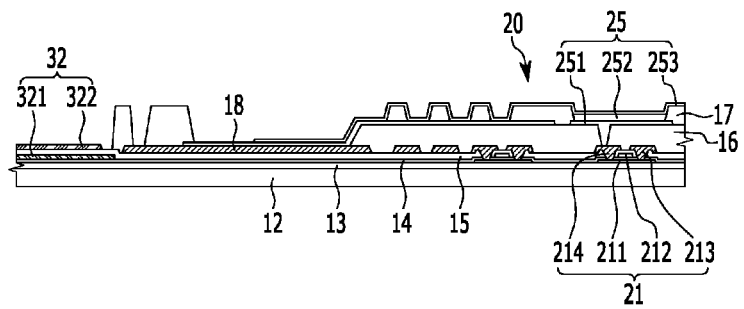
FIG. 6 is a partially enlarged cross-sectional view of FIG. 2, showing another modified exemplary embodiment of a dummy pattern according to the invention.

FIG. 6 is a partially enlarged cross-sectional view of FIG. 2, showing another modified exemplary embodiment of the dummy pattern shown in FIG. 4.

Referring to FIG. 6, a dummy pattern 32 has a multi-layer lamination structure of a first layer 321 and a second layer 322. The first layer 321 is formed of the same material as the gate electrode 212 of the thin film transistor 21 as one of a plurality of layers of the display unit 20, and is positioned in and/or on the same layer as the gate electrode 212. The second layer 322 is formed of the same material as the source and drain electrodes 213 and 214 of the thin film transistor 21 as another of the plurality of layers of the display unit 20, and is positioned in and/or on the same layer as the source and drain electrodes 213 and 214.

In still other modified exemplary embodiments, the dummy pattern may be formed of a same material as and in and/or on a same layer as the pixel electrode 251 or other layers in addition to the gate electrode 212 and the source and drain electrodes 213 and 214, the plurality of layers of the display unit 20.

Figure 7:
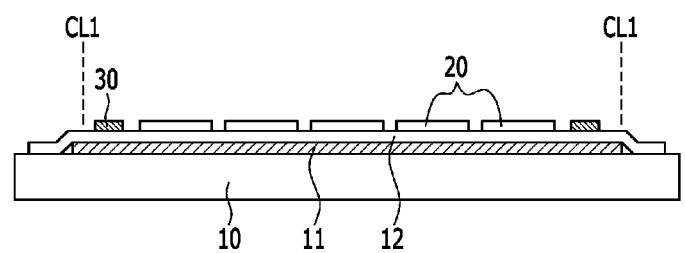
FIGS. 7(a) to 7(c) are cross-sectional views showing exemplary embodiments of states of a flexible display device formed in a fourth operation of shown in FIG. 1 in the method for manufacturing a flexible display device according to the invention.
Figure 7:
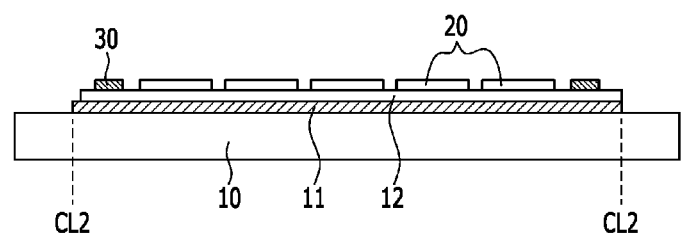
Figure 7:
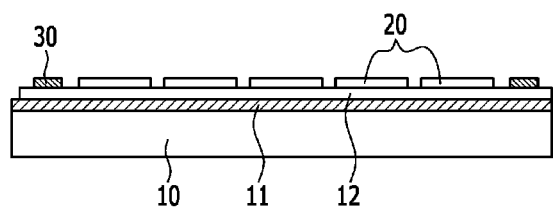
Figure 8:
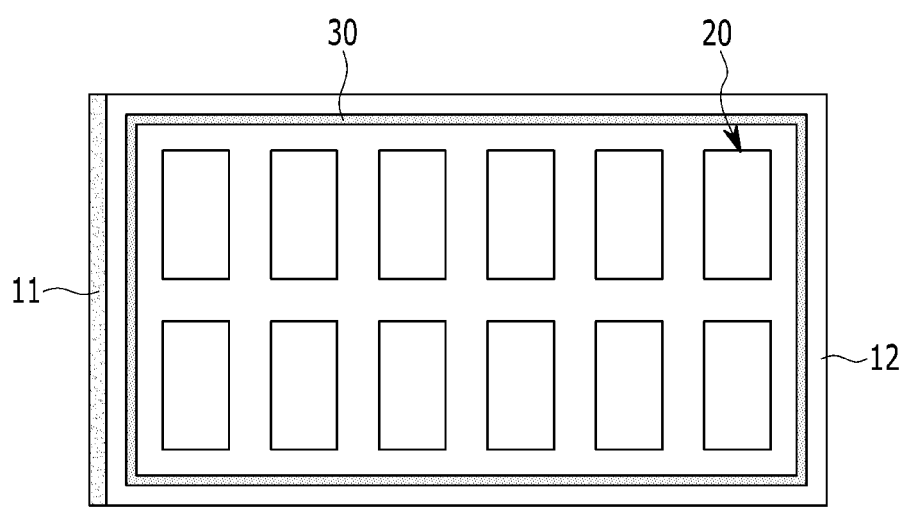
FIG. 8 is a top plan view showing the flexible display device in a state of FIG. 7(c).

FIGS. 7(*a*) to 7(*c*) are cross-sectional views showing exemplary embodiments of states of a flexible display devices formed in the fourth operation (S40) shown in FIG. 1 in the method for manufacturing a flexible display device according to the invention, and FIG. 8 is a top plan view showing the flexible display device in a state of FIG. 7(*c*). In the exemplary embodiment of FIGS. 7(*a*) to 7(*c*) and 9, the flexible substrate is still the mother substrate supporting a plurality of display units.

Referring to FIGS. 7(*a*) to 7(*c*) and 8, the flexible substrate 12 and the carrier substrate 10 are cut at at least one side such that a portion of the separation layer 11 is exposed during the fourth operation (S40).

Specifically, the edge of the flexible substrate 12 is cut along a first cutting line CL1 by using a cutting device such as a scribing wheel. The first cutting line CL1 overlaps the separation layer 11 at at least one side of the flexible substrate 12, such as being spaced apart from the edge at the one side of the flexible substrate 12. The first cutting line CL1 substantially conforms to and may be aligned with the edge of the separation layer 11 at remaining sides other than the first side. The dummy pattern 30 is positioned inside the first cutting line CL1.

Subsequently, the carrier substrate 10 is cut along a second cutting line CL2 by using the cutting device such as the scribing wheel. The second cutting line CL2 substantially conforms to and may be aligned with the edge of the separation layer 11. Cutting of the flexible substrate 12 may be performed in a downward direction, and cutting of the carrier substrate 10 may be performed in an upward direction, but the invention is not limited thereto.

As described above, the first cutting line CL1 and the second cutting line CL2 do not conform to each other (e.g., are offset from each other) at at least one side of the flexible substrate 12 and the carrier substrate 10. Accordingly, the separation layer 11 is exposed to the outside at an outer surface of at least one side of the flexible substrate 12. In FIGS. 7(*a*) to 7(*c*) and 8, the separation layer 11 is exposed at an outer surface of a left side of the flexible substrate 12 is shown as an example, but the invention is not limited thereto.

Fine cracks caused by cutting are present at the edge of the flexible substrate 12 during the fourth operation (S40). The fine cracks may be easily spread further into the flexible substrate 12 to cause breakage of the flexible substrate 12. However, the dummy pattern 30 is formed along the edge of the flexible substrate 12 inside of a cut surface thereof. Accordingly, spreading of the cracks initially formed at the cut surface of the flexible substrate 12 is suppressed by the dummy pattern 30.

That is, the dummy pattern 30 functions to suppress spreading of the cracks initially formed when the flexible substrate 12 is cut to inside of the dummy pattern 30, that is, past the dummy pattern 30 a direction toward an internal side of the flexible substrate 12. Accordingly, breakage of the flexible substrate 12 due to spreading of the cracks when the flexible substrate 12 is stripped, during the cutting process of the fourth operation (S40) and the fifth operation (S50) as will be described later, may be suppressed.

Further, the dummy pattern 30 functions to disperse stress due to cutting the flexible substrate 12. Accordingly, breakage of the flexible substrate 12 due to accumulation of stress, during the fifth operation (S50) or a subsequent process, may be suppressed. As a result, the flexible substrate 12 may be smoothly transported, occurrence of defects may be minimized and manufacturing quality of the flexible device including the flexible substrate 12 may be improved.

Figure 9:
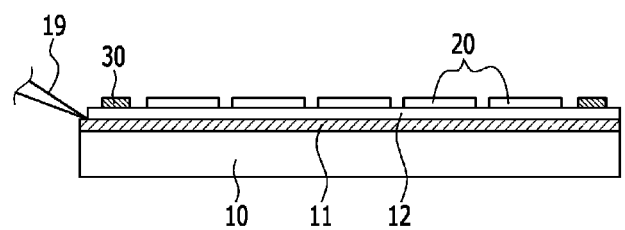
FIGS. 9(a) to 9(c) are cross-sectional views showing exemplary embodiments of states of a flexible display device formed in a fifth operation shown in FIG. 1 in the method for manufacturing a flexible display device according to the invention.
Figure 9:
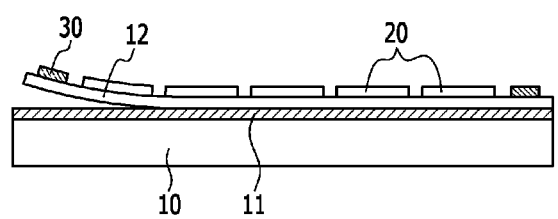
Figure 9:
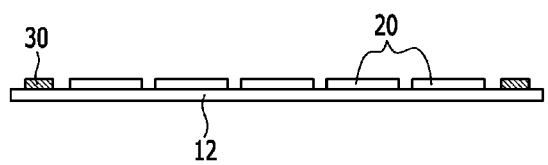

FIGS. 9(*a*) to 9(*c*) are cross-sectional views showing exemplary embodiments of a flexible display device of the fifth operation shown in FIG. 1 in the method for manufacturing a flexible display device according to the invention. In the exemplary embodiment of FIGS. 9(*a*) to 9(*c*), the flexible substrate is still the mother substrate supporting a plurality of display units.

Referring to FIGS. 9(*a*) to 9(*c*), the flexible substrate 12 is physically stripped from the separation layer 11 such as by inserting a stripping apparatus 19 between the exposed separation layer 11 and the edge of the flexible substrate 12. The stripping apparatus 19 may be a thin plate type of apparatus having a sharp end.

Since a portion of the separation layer 11 is exposed, the stripping apparatus 19 may be precisely positioned between the separation layer 11 and the flexible substrate 12, and defects occurring when the flexible substrate 12 is stripped may be reduced.

A cross-sectional thickness of the stripping apparatus 19 is larger than cross-sectional thicknesses of the flexible substrate 12 and the separation layer 11. Assuming that a portion of the separation layer 11 is not exposed and cut surfaces of the flexible substrate 12 and the separation layer 11 are set to substantially conform to each other (e.g., be substantially aligned or coplanar) during the fourth operation (S40), selecting a precise position of the stripping apparatus 19 may be difficult, and when the stripping apparatus 19 is inserted or applied to the flexible substrate 12 and the separation layer 11, a problem of breakage of the flexible substrate 12 and/or the separation layer 11 may occur.

The separation layer 11 may be formed to have a thickness of about 50 Å to about 300 Å. When the thickness of the separation layer 11 is less than about 50 Å, the flexible substrate 12 is easily broken when the flexible substrate 12 is separated from the separation layer 11. When the thickness of the separation layer 11 is more than about 300 Å, an air trap phenomenon where air is trapped between the carrier substrate 10 and the flexible substrate 12 may occur when the flexible substrate 12 is laminated on the carrier substrate 10 during the second operation (S20). Since bending portions are formed in the flexible substrate 12 when the flexible substrate is bent 12, process defects may occur during the third operation of forming a plurality of display units 20 (S30).

Adsorption strength of the flexible substrate 12 is increased as surface roughness of the separation layer 11 is reduced. However, when the flexible substrate 12 is separated during the fifth operation (S50), performing separation may be difficult. Further, when surface roughness of the separation layer 11 is increased to easily separate the flexible substrate 12, an area of the air trap may be increased when the flexible substrate 12 is laminated on the carrier substrate 10 during the second operation (S20).

Figure 10:
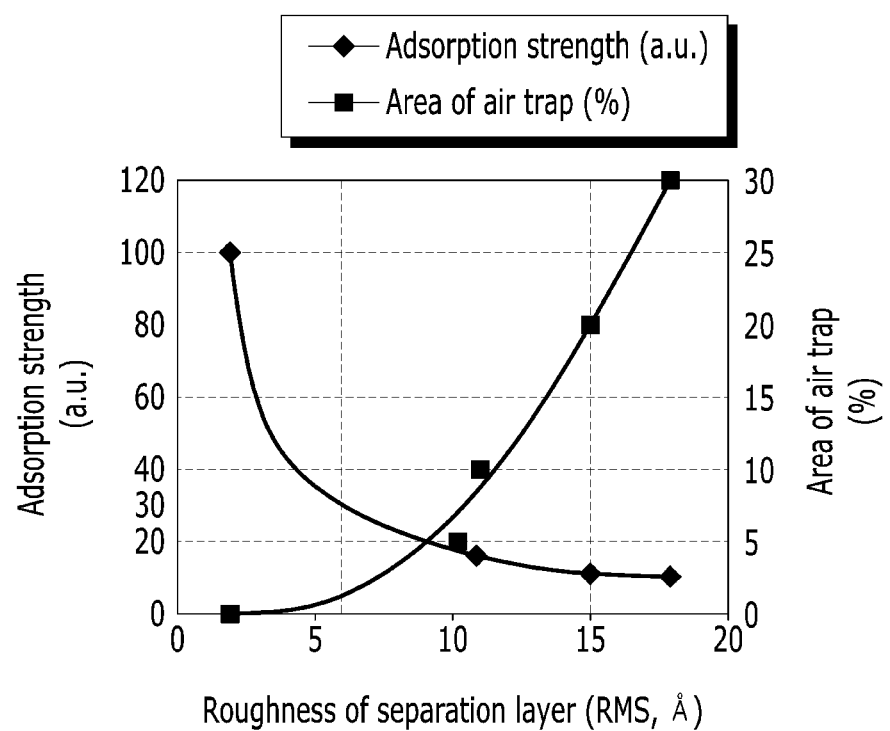
FIG. 10 is a graph showing adsorption strength (arbitrary units: a.u.) and an area of an air trap of a flexible substrate relative to a total area of the flexible substrate (percent:%), with respect to surface roughness (root mean square: RMS, in angstroms: Å) of a separation layer.

Accordingly, surface roughness of the separation layer 11 should satisfy an appropriate range in which the area of the air trap is reduced, appropriate adsorption strength is provided to the flexible substrate 12 and separation of the flexible substrate 12 during the fifth operation (S50) is relatively easy. FIG. 10 is a graph showing adsorption strength (arbitrary unit: a.u.) and an area of the air trap of the flexible substrate relative to a total area of the flexible substrate (percent:%), with respect to surface roughness (Å) of the separation layer. In FIG. 10, surface roughness is represented by a root mean square ("RMS") value, and a unit of adsorption strength is an arbitrary unit (a.u.) and indicates a relative value.

Referring to FIG. 10, only when adsorption strength of the flexible substrate 12 does not exceed 30 may the flexible substrate 12 be easily separated during the fifth operation (S50). Further, only when the area of the air trap does not exceed 20% of the total area of the flexible substrate 12 may defects of the display unit 20 be suppressed during the third operation (S30). In consideration of this, in one exemplary embodiment, the separation layer 11 may have surface roughness of about 6 Å to about 15 Å.

Returning again to the method for manufacturing a flexible display device according to the invention, the flexible substrate 12 separated from the separation layer 11 and the carrier substrate 10 is subjected to an encapsulation process, and a cell cutting process in which a cutting line is set between the plurality of display units 20 to divide the plurality of display units 20 into individual flexible display devices.

Figure 11:
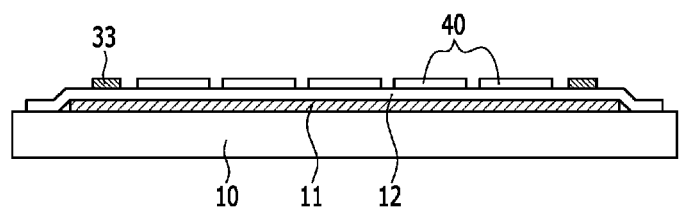
FIG. 11 is a cross-sectional view showing another exemplary embodiment of a flexible display device formed in the third operation shown in FIG. 1 in the method for manufacturing a flexible display device according to the invention.

FIG. 11 is a cross-sectional view showing another exemplary embodiment of a flexible display device of the third operation (S30) shown in FIG. 1 in the method for manufacturing a flexible display device according to the invention.

Referring to FIG. 11, the exemplary embodiment of the manufacturing method is the same as the manufacturing method of the previously described exemplary embodiment in which the flexible substrate is the mother substrate supporting a plurality of display units, except that the flexible substrate 12 is a mother substrate for encapsulation supporting a plurality of touch sensor units 40. Hereinafter, elements that are different from those of the previous exemplary embodiment will be mainly described, and the same members as those of the previous exemplary embodiment will be designated by the same reference numerals.

A plurality of touch sensor units 40 and a dummy pattern 33 are simultaneously formed on the flexible substrate 12 during the third operation (S30). The plurality of touch sensor units 40 are positioned to be spaced apart from each other. The dummy pattern 33 is formed in parallel with the edge of the flexible substrate 12 so as to surround all of the plurality of touch sensor units 40. The dummy pattern 33 and the plurality of touch sensor units 40 overlap the separation layer 11 in the plan view. An edge of an external side of the dummy pattern 33 is positioned to be spaced apart from an edge of the separation layer 11 in a direction toward an internal side of the separation layer 11.

One touch sensor unit 40 corresponds to one flexible display device. Each touch sensor unit 40 may include a plurality of sensing patterns, an insulating layer and a protective layer. The dummy pattern 33 is formed in an same layer as and include a same material as at least one layer of a plurality of layers of the touch sensor unit 40.

Figure 12A:
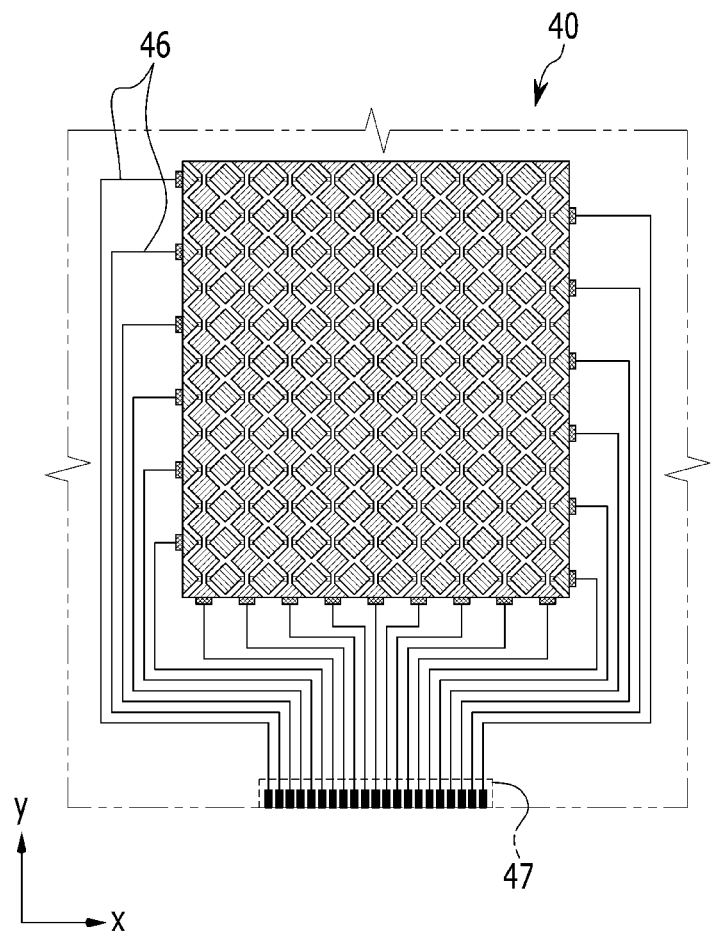
FIGS. 12(A) and 12(B) are a schematic diagram and enlarged view, respectively, showing an exemplary embodiment of a touch sensor unit according to the invention.
Figure 12B:
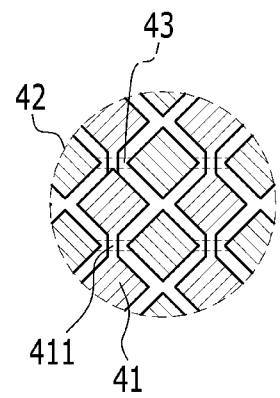
Figure 13:
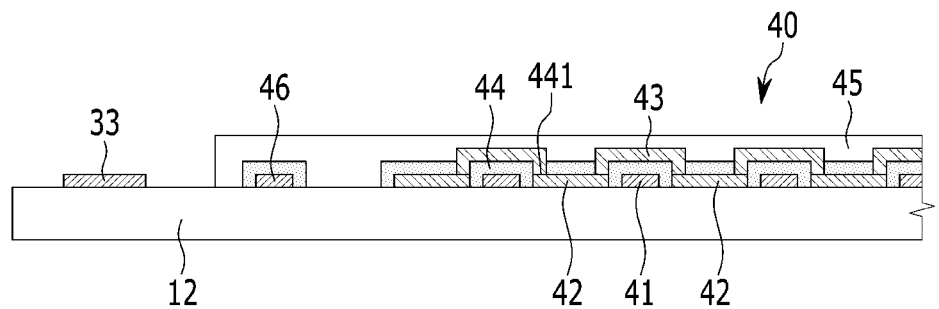
FIG. 13 is a partially enlarged cross-sectional view of FIG. 11, showing an exemplary embodiment of a dummy pattern according to the invention.

FIG. 12 is a schematic diagram showing an exemplary embodiment of a touch sensor unit, and FIG. 13 is a partially enlarged cross-sectional view of FIG. 11 in which the dummy pattern and the touch sensor unit are shown to be partially enlarged.

Referring to FIGS. 12 and 13, the touch sensor unit 40 may include first sensing patterns 41 continuously formed to be elongated in a first direction, second sensing patterns 42 discontinuously formed in a second direction, and connection patterns 43 electrically connecting the discontinuous second sensing patterns 42 to each other. The first direction may be set as a y-axis (Y) direction, and the second direction may be set as an x-axis (X) direction.

The first sensing patterns 41 and the second sensing pattern 42 are arranged parallel to each other on the flexible substrate 12 while being spaced apart from each other. A group of first sensing patterns 41 has a length parallel to the second direction. A group of first sensing patterns 41 are continuously formed in the first direction by joint units 411 thereof having a relatively narrow width taken perpendicular to the length of the group of first sensing patterns 41 as compared to the maximum width of the first sensing patterns 41. The second sensing patterns 42 are formed as a discontinuous pattern between the joint units 411.

The first sensing pattern 41 and the second sensing pattern 42 are covered by an insulating layer 44. Via holes 441 through which a portion of the second sensing pattern 42 is exposed are formed through the insulating layer 44. In addition, the connection pattern 43 is formed on the insulating layer 44. The connection pattern 43 comes into contact with the second sensing patterns 42 through the via holes 441 to electrically connect the second sensing patterns 42 to each other in the first direction.

The first sensing pattern 41, the second sensing pattern 42 and the connection pattern 43 are covered by a protective layer 45. The first sensing patterns 41 and the second sensing patterns 42 are connected to corresponding wires 46. The wires 46 are connected to a driving circuit (not shown) through a pad unit 47.

The first sensing pattern 41 and the second sensing pattern 42 may be formed of a transparent conductive layer so as to not prevent light transmission therethrough. In one exemplary embodiment, for example, the first sensing pattern 41 and the second sensing pattern 42 may include any one of indium tin oxide ("ITO"), indium zinc oxide ("IZO"), zinc oxide (ZnO), and indium oxide ($In_2O_3$). The connection pattern 43 and the wire 46 may be formed of a layer of metal such as molybdenum (Mo), copper (Cu), aluminum (Al), nickel (Ni), and chromium (Cr). In addition, the insulating layer 44 and the protective layer 45 may be formed of a transparent insulating material.

The touch sensor unit 40 is a capacitance type sensor. When an object such as a human hand or a touch pen comes into contact with the touch sensor unit 40, a change in capacitance according to a contact position is transferred to a driving circuit through the sensing patterns 41 and 42 and the wire 46, and is converted into an electric signal in a position input processing circuit (not shown), and thus the contact position may be identified.

A structure of the touch sensor unit 40 is not limited to the shown capacitance type, but the method of manufacturing a flexible display device may be applied to all types of touch sensor units having a touch function.

The dummy pattern 33 may be formed in a same layer as and include a same material as any one of the sensing patterns 41 and 42, the connection pattern 43, and the wires 46 among a plurality of layers of the touch sensor unit 40. That is, the dummy pattern 33 may be formed of a transparent conductive layer (metal oxide) or a metal layer.

Figure 14:
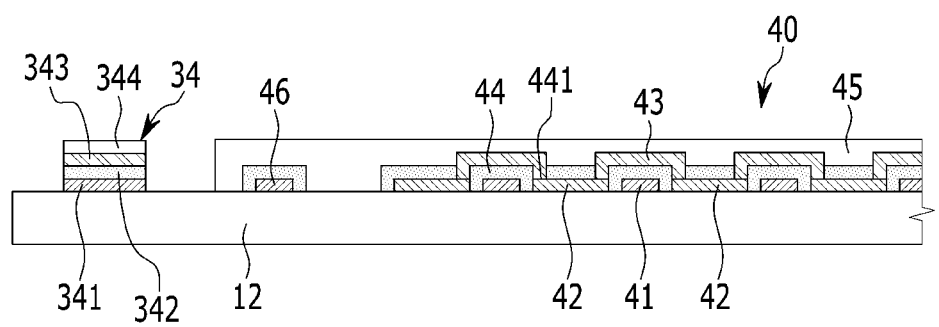
FIG. 14 is a partially enlarged cross-sectional view of FIG. 11, showing a modified exemplary embodiment of a dummy pattern according to the invention.

FIG. 14 is a partially enlarged cross-sectional view of FIG. 11, showing a modified exemplary embodiment of the dummy pattern shown in FIG. 12.

Referring to FIG. 14, a dummy pattern 34 has a multi-layer lamination structure including a plurality of layers. In one exemplary embodiment, for example, the dummy pattern 34 may have a multi-layer lamination structure of first to fourth layers 341, 342, 343 and 344. The first layer 341, the second layer 342, the third layer 343 and the fourth layer 344 may be formed in an same layer as and of the same material as the sensing patterns 41 and 42, the insulating layer 44, the connection pattern 43 and the protective layer 45, respectively.

In the manufacturing method illustrated in FIG. 12 to FIG. 14, the dummy patterns 33 and 34 suppress spreading of cracks initially formed when the flexible substrate 12 is cut during the fourth operation (S40) to the inside of the dummy patterns 33 and 34, that is, past the dummy pattern 30 a direction toward an internal side of the flexible substrate 12, thus preventing breakage of the flexible substrate 12. Further, the dummy patterns 33 and 34 disperse stress generated in cutting of the flexible substrate 12 to suppress breakage of the flexible substrate 12 according to accumulation of stress during one or more subsequent processes.

In the manufacturing method illustrated in FIG. 12 to FIG. 14, the fourth operation (S40) and the fifth operation (S50) are the same as those of the previous exemplary embodiment. The flexible substrate 12 separated from the carrier substrate 10 during the fifth operation (S50) may be sealed with a mother substrate supporting a plurality of display units, and the two mother substrates are subjected to a cell cutting process to be divided into individual flexible display devices.

One dummy pattern formed along the edge of the flexible substrate 12 is shown in the drawings for explaining the method of manufacturing a flexible display device. However, in an alternative exemplary embodiment of a method of manufacturing a flexible display device, a plurality of dummy patterns may be formed while being spaced apart from each other.

Figure 15:
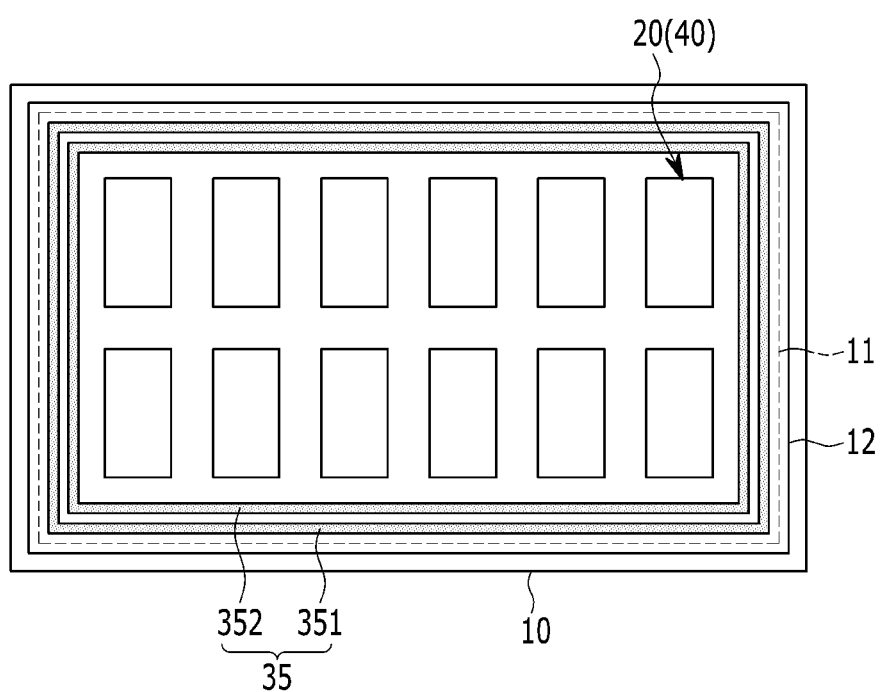
FIG. 15 is a plan view showing still another exemplary embodiment of a flexible display device forming in the third operation shown in FIG. 1 in the method for manufacturing a flexible display device according to the invention.

FIG. 15 is a plan view showing still another exemplary embodiment of a flexible display device formed in the third operation (S30) shown in FIG. 1 in the method for manufacturing a flexible display device according to the invention.

Referring to FIG. 15, a dummy pattern 35 includes an external dummy pattern 351 and an internal dummy pattern 352 spaced apart from each other. Both the external dummy pattern 351 and the internal dummy pattern 352 are continuously formed along the edge of the flexible substrate 12.

The doubly formed dummy pattern 35 may suppress spreading of cracks initially formed on a cut surface of the flexible substrate 12 during a cutting process of the fourth operation (S40) to the inside thereof through two stages defined by the doubly formed dummy pattern 35. Accordingly, the doubly formed dummy pattern 35 may more effectively suppress breakage of the flexible substrate 12 according to spreading of cracks as compared to where a single dummy pattern is provided.

While this disclosure has been described in connection with what is presently considered to be practical exemplary embodiments, it is to be understood that the invention is not limited to the disclosed exemplary embodiments, but, on the contrary, is intended to cover various modifications and equivalent arrangements included within the scope of the appended claims, detailed description of the invention, and drawings.

What is claimed is:

1. A method for manufacturing a flexible display device, comprising:
    forming a separation layer on a carrier substrate;
    laminating a flexible substrate having an area which is larger than that of the separation layer, to the separation layer;
    forming a dummy pattern on and along an edge of the flexible substrate;
    removing a portion of the flexible substrate having the area which is larger than that of the separation layer, at a side of the flexible substrate, to define the flexible substrate with the dummy pattern thereon to have an area smaller than that of the separation layer,
    wherein the flexible substrate having the smaller than that of the separation layer exposes a portion of the separation layer, the exposed portion of the separation layer extended further than an edge of the flexible substrate having the area smaller than that of the separation layer; and
    separating the separation layer and the extended portion thereof from the flexible substrate having the area smaller than that of the separation layer.

2. The method of claim 1, wherein
    the carrier substrate and the flexible substrate comprise glass, and
    the flexible substrate has a cross-sectional thickness which is smaller than that of the carrier substrate.

3. The method of claim 2, wherein the separation layer comprises a metal oxide comprising aluminum zinc oxide.

4. The method of claim 3, wherein the separation layer has a thickness of about 50 angstroms to about 300 angstroms and
    surface roughness of about 6 angstroms to about 15 angstroms.

5. The method of claim 1, wherein
    in the exposing the portion of the separation layer, the flexible substrate is cut along a first cutting line,
    wherein the first cutting line
        is spaced apart from an edge of the separation layer at the side of the flexible substrate, and
        is aligned with an edge of the separation layer at remaining sides of the flexible substrate except for the side of the flexible substrate at which the portion of the separation layer is removed.

6. The method of claim 5, further comprising
    removing a portion of the carrier substrate by cutting the carrier substrate along a second cutting line,
    wherein the second cutting line is aligned with the edge of the separation layer at each side of the flexible substrate.

7. The method of claim 1, wherein in the separating the separation layer and the extended portion thereof from the flexible substrate having the area smaller than that of the separation layer, a stripping apparatus is inserted between the extended portion of the separation layer and the edge of the flexible substrate having the area smaller than that of the separation layer.

8. The method of claim 1, wherein
    in the forming the dummy pattern, a display unit comprising a plurality of layers is formed inside the dummy pattern, and
    the dummy pattern is formed of a same material as a layer among the plurality of layers of the display unit.

9. The method of claim 8, wherein
    the display unit and the dummy pattern overlap the separation layer, and
    an edge of an external side of the dummy pattern is inside an edge of an external side of the separation layer.

10. The method of claim 9, wherein the dummy pattern comprises at a same side of the display unit, an internal dummy pattern portion, and an external dummy pattern portion closer to the edge of the external side of the separation layer than the internal dummy pattern portion.

11. The method of claim 8, wherein
    the display unit comprises a thin film transistor and an organic light emitting diode,
    the thin film transistor comprises a semiconductor layer, a gate electrode and source and drain electrodes, and
    the organic light emitting diode comprises a pixel electrode, an organic light emitting layer and a common electrode.

12. The method of claim 11, wherein the dummy pattern is formed of a same material as the gate electrode or the source and drain electrodes.

13. The method of claim 11, wherein
the dummy pattern comprises:
- a first layer formed of a same material as the gate electrode; and
- a second layer formed of a same material as the source and drain electrodes.

14. The method of any one of claim 1, wherein,
in the forming the dummy pattern, a touch sensor unit comprising a plurality of layers is formed inside the dummy pattern, and
the dummy pattern is formed of a same material a layer among the plurality of layers of of the touch sensor unit.

15. The method of claim 14, wherein
the touch sensor unit and the dummy pattern overlap the separation layer, and
an edge of an external side of the dummy pattern is inside an edge of an external side of the separation layer.

16. The method of claim 15, wherein the dummy pattern comprises at a same side of the touch sensor unit, an internal dummy pattern portion, and an external dummy pattern portion closer to the edge of the external side of the separation layer than the internal dummy pattern portion.

17. The method of claim 14, wherein
the touch sensor unit comprises:
- first sensing patterns continuously extended in a first direction;
- discrete second sensing patterns arranged in a second direction crossing the first direction, and electrically connected to each other by a connection pattern; an
- a plurality of wires connected to the first sensing patterns and the second sensing patterns.

18. The method of claim 17, wherein the dummy pattern is formed of a same material as the first sensing patterns, the second sensing patterns, the connection pattern or the plurality of wires.

19. The method of claim 17, wherein
the touch sensor unit comprises:
- an insulating layer covering the first sensing patterns and the second sensing patterns, and a via hole defined in the insulating layer, and
- a protective layer covering the connection pattern,
- wherein the connection pattern is connected to the second sensing patterns through the via hole.

20. The method of claim 19, wherein
the dummy pattern comprises:
- a first layer formed of a same material as the first sensing patterns and the second sensing patterns;
- a second layer formed of a same material as the insulating layer;
- a third layer formed of a same material as the connection pattern; and
- a fourth layer formed of a same material as the protective layer.

* * * * *